United States Patent
Legnani et al.

(10) Patent No.: US 6,262,454 B1
(45) Date of Patent: Jul. 17, 2001

(54) PROTECTION STRUCTURE FOR HIGH-VOLTAGE INTEGRATED ELECTRONIC DEVICES

(75) Inventors: Marco Alessandro Legnani, Saronno; Albino Pidutti, Udine, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/256,530

(22) Filed: Feb. 24, 1999

(30) Foreign Application Priority Data

Feb. 24, 1998 (EP) .................................. 98830095

(51) Int. Cl.⁷ .................................. H01L 29/72
(52) U.S. Cl. .................. 257/355; 257/356; 257/358; 257/630; 257/773
(58) Field of Search .................. 257/355, 356, 257/358, 630, 773

(56) References Cited

U.S. PATENT DOCUMENTS

| 5,349,232 | 9/1994 | Mille et al. | 257/603 |
| 5,382,825 | 1/1995 | Neilson | 257/489 |
| 5,382,826 | 1/1995 | Mojaradi et al. | 257/489 |

FOREIGN PATENT DOCUMENTS

| 0 588 067 A2 | 3/1994 | (EP) . |
| 0 588 067 A3 | 3/1994 | (EP) . |
| 03089554 | 4/1991 | (JP) . |
| 3-89554 * | 4/1991 | (JP) | 257/355 |
| WO 94/16462 * | 4/1991 | (WO) | 257/355 |
| WO 94/16462 | 7/1994 | (WO) . |

OTHER PUBLICATIONS

Endo et al., "A 500V 1A 1–Chip Inverter IC With A New Electric Field Reduction Structure," in *Proc. of the 6th Internat. Sympos. on Power Semiconductor Devices & IC's*, Davos, Switzerland, May 31–Jun. 2, 1994.

* cited by examiner

Primary Examiner—Edward Wojciechowicz
(74) Attorney, Agent, or Firm—Theodore E. Galanthay; Charles J. Rupnick; Seed Intellectual Property Law Group PLLC

(57) ABSTRACT

A protective structure having a plurality of protection regions extending along closed lines arranged inside each other. Each intermediate protective region is tangent to two different adjacent protective regions, at different areas, so as to form a connection in series with the adjacent protective regions. The protective structure can be of resistive material, such as to form a series of resistors, or it can include doped portions alternately of P- and N-type, such as to form a plurality of anti-series arranged diodes. The structure can be made of polycrystalline silicon extending on the substrate surface, or can be integrated (implanted or diffused) inside the substrate.

41 Claims, 2 Drawing Sheets

PROTECTION STRUCTURE FOR HIGH-VOLTAGE INTEGRATED ELECTRONIC DEVICES

TECHNICAL FIELD

The present invention relates to a protection structure for high-voltage integrated electronic devices.

BACKGROUND OF THE INVENTION

One of the main problems encountered in the production of high-voltage electronic devices is due to the establishment of high electrical fields on the surface of the device, which can cause premature breakdowns between high and low voltage regions (for example between sink and source terminal of high voltage MOS transistors), and instability of the electrical parameters of the device during its life, owing to charges outside the component (e.g., polarization of the passivation material, ionic contamination, and polarization of the resin of the package).

Various solutions have been proposed in order to reduce the surface electrical fields. Among these, a technique which is widely used at present in the production of lateral devices uses a lightly doped layer (epitaxial layer optionally doped by implantation), which makes it possible to considerably decrease the surface electrical fields, and thus to obtain higher breakdown voltages. However, this solution causes the device to be highly sensitive to charges localized outside of the device, for example in the package resin, in the passivation oxide layers, and in the dielectric layers deposited at the end of the production process.

In addition, when the high voltage devices are connected to other components, it is difficult to connect the high voltage biased terminal using standard techniques (e.g., metallization extending on the insulation surface), without inducing premature breakdowns.

Structures have thus been proposed to protect the device surface and to distribute the electrical potential as uniformly as possible over extensive areas, so as to reduce crowding of electrical field lines. In particular, the use of spiral-shaped resistive components has been proposed, extending between high voltage regions and low voltage regions, so as to generate linear equal distribution of the potential, beginning from the center to the periphery of the device (see for example U.S. Pat. No. 5,349,232, EP-A-574,643, U.S. Pat. No. 5,382,825, U.S. Pat. No. 5,382,826 and the article "A 500V 1A 1-Chip Inverter IC with a New Electric Field Reduction Structure" by Koichi Endo, Yoshiro Baba, Yuso Udo, Mitsuru Yasui and Yoshiyuki Sano, Proc. of the 6th Internat. Symposium on Power Semiconductor Devices & ICs, Davos, Switzerland, May 31–Jun. 2, 1994). A variant in the use of resistive components includes the use of silicon junction diode chains (again see U.S. Pat. No. 5,382,825 and U.S. Pat. No. 5,349,232), or of a dielectric capacitor chain (see U.S. Pat. No. 5,040,045).

SUMMARY OF THE INVENTION

Accordingly, one object of the present invention is to provide a further protection structure which functions efficiently in preventing establishment of localized electrical fields inside the device, generated by external charges. According to principles of the present invention, a substrate of semiconductor material is provided with a plurality of protection regions of increased doping concentration. In one embodiment, the doping concentration is of the opposite conductivity type as the substrate. The doped region in the substrates are concentrically formed arranged in close lines, one inside another. Each ring is contiguous with each adjacent ring along at least a portion of each respective ring. Preferably, the contiguous portion alternates on either side of the respective ring so that the rings are connected reciprocally in series. In a first embodiment, the rings are cylindrical in nature, but in other embodiments they are oval, square, or other acceptable shape for forming the desired protection regions that extend along closed lines, arranged one inside the other.

DETAILED DESCRIPTION OF THE INVENTION

Figure 1:
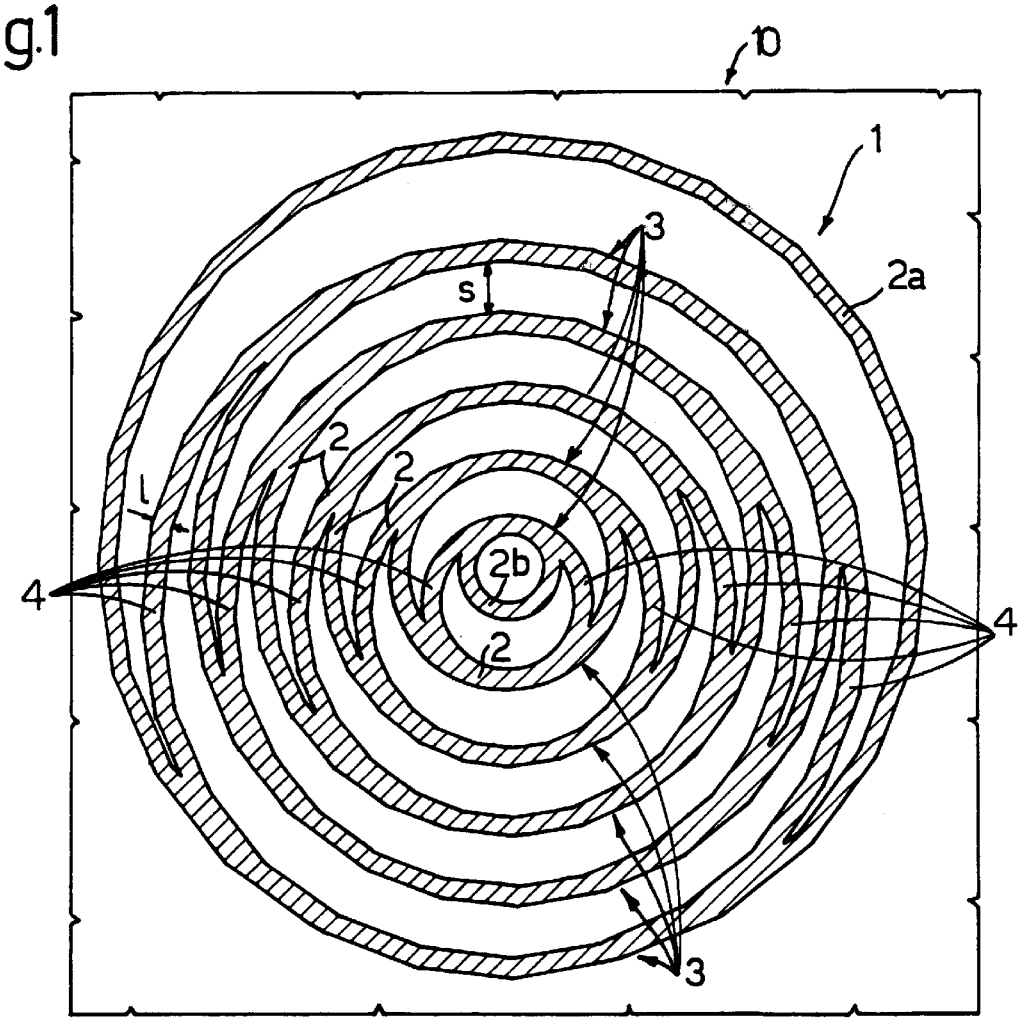
FIG. 1 shows a top view of a protective structure according to an embodiment of the invention.

According to the invention, the protective structure 1 comprises a plurality of protective regions of electrically conductive material, which extend along closed lines (for example circles or polygons) arranged one inside another, so as to be connected in series between an outermost protection region 2a and an innermost protection region 2b. In particular, the protective regions are typically a semiconductor material, and have reciprocal tangency areas 3 offset from one another, such that the two areas in which an intermediate protective region contacts the two adjacent protective regions (one internally and the other externally), are different. In the case of protective regions 2 shaped as circumferences, these tangency areas 3 can be arranged diametrically to one another. In this case, in practice, there are two groups of circumferences; each group of circumferences comprises mutually concentric circumferences which are arranged eccentrically and alternately to the circumferences of the other group. The tangency areas 3 may be two overlapping portions of the two adjacent protective regions 2, or two contiguous portions in electrical contact.

In one embodiment, the protective structure 1 may be made of a resistive material, so as to form a resistive component having uniform characteristics over its entire area so as to form resistors in series, or it may be made of doped portions of a semiconductor material which are alternately P- and N-type, so as to form a plurality of diodes arranged in anti-series to each other (i.e., a cathode of a first diode being coupled to a cathode of a second diode, an anode of the second diode being coupled to an anode of a third diode, etc.).

In another embodiment, the structure 1 may be a polycrystalline silicon extending above the surface of the substrate, or integrated (i.e., implanted or diffused) into the substrate itself. Optionally, the protective structure I may have portions extending above the substrate and integrated portions, analogous to the solution disclosed in U.S. Pat. No. 5,349,232.

FIG. 1 shows a top view of an embodiment of the present protective structure 1. As shown in FIG. 1, the structure 1 comprises a plurality of protective regions 2, which in this case have a polygonal shape with 24 sides, approximating a series of circumferences arranged one within another, and having a decreasing diameter, starting from the outermost protective region (indicated as 2a), towards the innermost protection region (indicated as 2b). The protective regions 2 overlap one another in areas, also known as tangency areas 3, which are offset from one another by approximately 180°, such that each protective region 2 is in contact with the internal and external protection regions adjacent to it, at diametrically opposed tangency areas 3.

The extreme protection regions (outermost protection region 2a, and innermost protection region 2b) are disposed between different potential regions of a device 10 which must be protected against breakdown conditions; in particular, as will 15 be described in greater detail below with reference to the embodiments of FIGS. 2 and 3, the outermost protection region 2a is typically arranged near, or adjacent to a low voltage protection region of the device 10, and the innermost protection region 2b is typically arranged near or adjacent to a high voltage region.

Due to the above described arrangement, the distance between two adjacent protective regions 2 increases as the distance between the reciprocal tangency areas 3 increases, until the maximum value is reached at the area which is arranged diametrically, where the difference of potential between the two protection regions is maximal. Thereby, the electrical field on the device 10 is distributed uniformly, eliminating flow line crowding areas (i.e., dense areas of equipotential lines from an electric field).

The protective regions 2 preferably have a width 1 which is as narrow as possible; similarly the maximum spacing s (measured in a diametrical position with respect to the tangency area 3) is preferably as small as possible, and the same for all the protection regions 2, in as far as the limits imposed by the lithographic process allow, so as to obtain a maximum resistance value or a maximum number of diodes.

By virtue of the structure 1 of FIG. 1. the resistance contribution of each protective region 2 is the same as that of two half-circumferences in parallel, i.e., it is a quarter of the resistive value of each protective region. In the case of diodes on the other hand, two parallel chains of series-arranged diodes are obtained.

In an alternate embodiment (also shown in FIG. 1), the protective structure 1 is made up of at least two protective regions 3, each in the shape of a closed polygon aligned about a common point (e.g., concentric). Each protective region 3 is electrically coupled to an adjacent protective region 3 by at least two connecting arms 4. The connecting arms 4 may be positioned so that one arm 4 is an approximate mirror image of the other arm 4 coupled to the same protective region 3 with respect to an imaginary line bisecting the respective protective region 3. The connecting arms 4 are typically curved and approximately involute with respect to the outer protective region 3 to which they are attached, and approximately tangential with respect to the inner protective region to which they are attached, but need not be.

Figure 2:
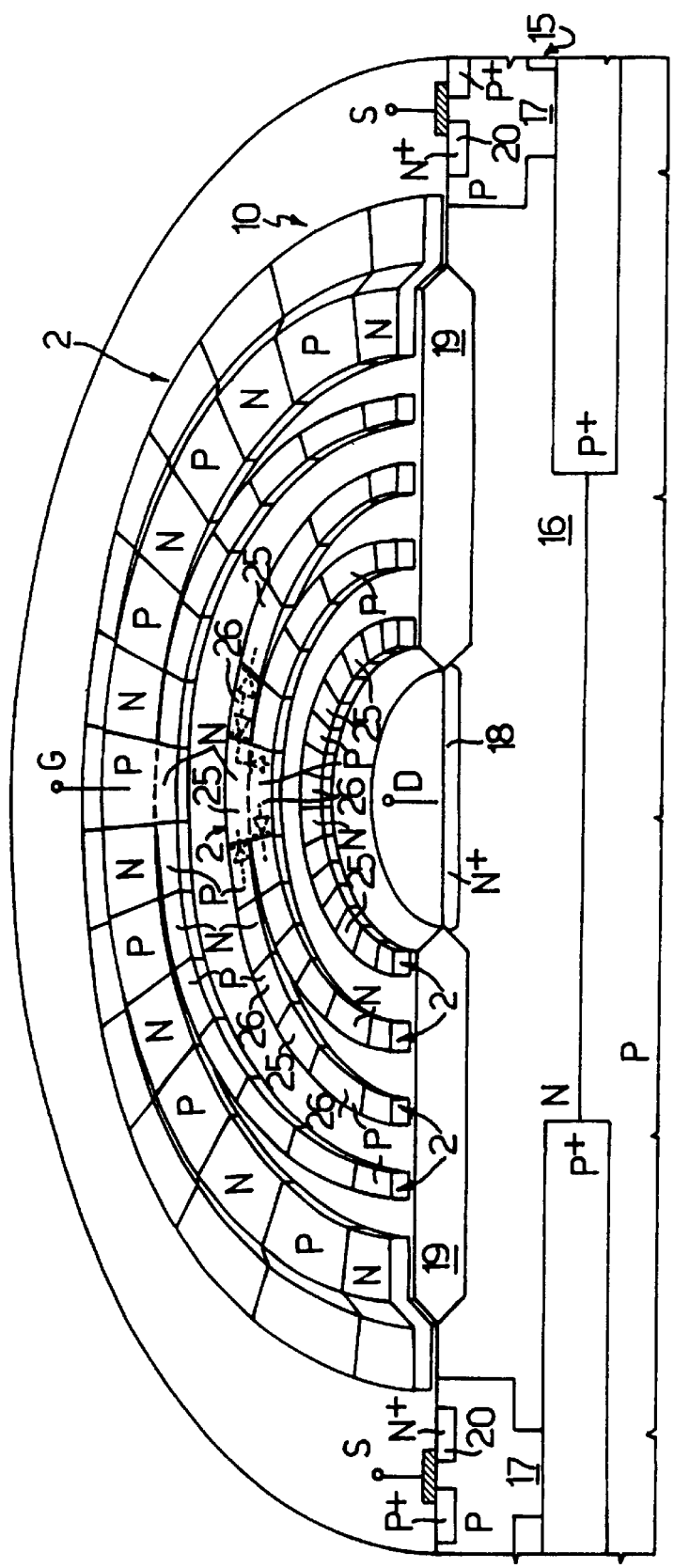
FIG. 2 shows a cross-sectional view of an integrated device having the protective structure of FIG. 1.

FIG. 2 shows a cross-section of a lateral DMOS transistor having the protective structure 1. In detail, in FIG. 2, in a wafer 15 which comprises an epitaxial layer 16 of N-type semiconductor material, accommodating a body region 17 of P-type semiconductor material, a sink region 18 of $N^+$-type semiconductor material is formed, surrounded by a thick oxide layer (field oxide 19), which extends between a sink region 18 and a body region 17. Inside the body region 17 there is a source region 20 of $N^+$-type semiconductor material. The protective structure 10 is formed on the surface of the wafer 15, partly on the field oxide region 19 and partly on the free surface of epitaxial layer 16, electrically insulated from the surface of the epitaxial layer 16 by a dielectric layer (not shown), is arranged between the sink region 18 and the source region 19, and forms a gate region of the DMOS transistor.

In the embodiment of FIG. 2, the protective regions 2 are doped so as to form portions alternately of N-type (portions 25) and of P-type (portions 26) semiconductor material, so as to form a plurality of diodes (some of which are represented by broken lines), in anti-series. In addition, in the example shown, the protective regions 2 are disposed contiguously to one another at the tangency areas, without reciprocal overlapping (and therefore different from the arrangement shown in FIG. 1).

Figure 3:
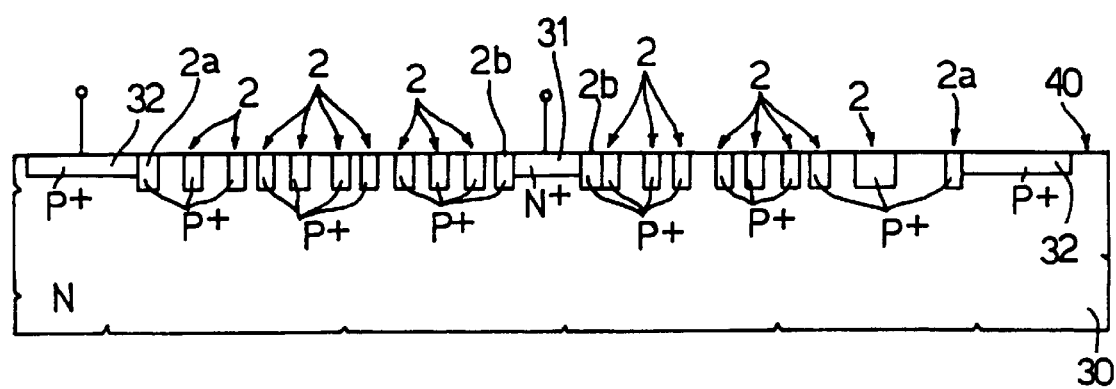
FIG. 3 shows a cross-sectional view of a protective structure according to another embodiment of the invention.

In the embodiment of FIG. 3, the protective structure 10 is formed inside a substrate 30 of N-type semiconductor material having a surface 40, and comprises protection regions 2 of $P^+$-type semiconductor material implanted or diffused in the substrate 30, and thus forming a resistive-type protection. In particular, the innermost protection region 2b externally delimits a first region 31 of $N^+$-type semiconductor material for biasing the substrate 30 to a high voltage (e.g., 400 V). The outermost protection region 2a internally delimits a second region 32 of $P^+$-type semiconductor material, which is set to a potential which is very different from that of the first region 31 (e.g., 0 V).

Thereby, the protective structure 1 ensures uniform potential distribution on the surface 40 of the substrate 30, between the potentials of first region 31 and second region 32.

The protective structure 1 thereby allows uniform distribution of the potential near the surface of an electronic device, thus preventing dangerous crowding of the flow lines. In addition, when polysilicon is used on the substrate, the structure forms an electrostatic screen which is separated from the silicon structure of the component to be protected. Thus, it is possible to produce metal connection lines and regions extending above the device areas which are interposed between the regions with different potential, without reducing the breakdown voltage of the device.

Finally, it is apparent that many changes and variants can be made to the structure described and illustrated here, all of which come within the scope of the inventive concept, as defined in the attached claims. Accordingly, the invention is not limited except as by the appended claims.

What is claimed is:

1. A protection structure for high-voltage integrated electronic devices comprising:

a semiconductor substrate;

a plurality of protection regions of electrically conductive material positioned between respective first and second voltage regions of the semiconductor substrate, wherein said protection regions extend along closed lines arranged one inside another with adjacent closed lines spaced apart by a distance that increases from a minimum to a maximum and connected in series.

2. The structure according to claim 1 wherein each said protection region has a first tangency area with a protection region which is internally adjacent, and a second tangency area with a protection region which is externally adjacent, the second tangency area being different from said first tangency area.

3. The structure according to claim 2 wherein said tangency areas comprise partially overlapping portions between adjacent protection regions.

4. The structure according to claim 2 wherein said closed lines are circumferences.

5. The structure according to claim 4 wherein said first and second tangency areas are diametrically opposed.

6. The structure according to claim 2 wherein said closed lines are polygons.

7. The structure according to claim 1 wherein said protection regions comprise resistive material forming a plurality of parallel arranged resistor pairs, said resistor pairs being disposed in series to each other.

8. The structure according to claim 1 wherein said protection regions comprise doped portions alternately of P- and N-type, and form a plurality of diodes in antiseries.

9. The structure according to claim 1 wherein said protection regions are made of polycrystalline silicon which extends on the surface of a substrate.

10. The structure according to claim 1 wherein said protection regions are formed in a substrate of semiconductor material.

11. The structure according to claim 1 wherein the structure extends between a first conductive region set to a first potential and a second conductive region set to a second potential which is different from said first potential.

12. The structure according to claim 1 wherein said protection regions have equal widths.

13. A protective structure for distributing voltage from an electric field, comprising:

a plurality of protective regions each arranged in the approximate shape of a closed polygon around a common point of a semiconductor substrate, each subsequent region surrounding and offset from each respective previous region, each region electrically coupled to each internal and external regions adjacent to it at respective coupling points that are offset from each other by approximately 180 degrees such that each region having an internal and external region adjacent to it has two coupling points that are approximately diametrically opposite each other. each of the protective regions being an electrically conductive material.

14. The protective structure of claim 13 wherein the at least part of the protective regions are disposed between a first area of a semiconductor substrate having a first voltage potential and a second area having a second voltage potential such that the first area is outside of the polygons defined by the protective regions and the second area is within the interior of a polygon defined by one of the protective regions.

15. The protective structure of claim 13 wherein the electrically conductive material comprises one of a resistive material and doped portions of a semiconductor material forming a plurality of diodes coupled together in anti-series.

16. The protective structure of claim 13 wherein the plurality of protective regions comprise polycrystalline silicon, and each of the protective regions is disposed over a substrate.

17. The protective structure of claim 13 wherein the plurality of protective regions are disposed within a substrate of a semiconductor material.

18. The protective structure of claim 13 wherein the polygons approximately comprise a circle.

19. A protective structure for distributing voltage from an electric field, comprising:

a plurality of protective regions each arranged in the approximate shape of a closed polygon concentrically aligned about a common point of a semiconductor substrate, each of the protective regions being an electrically conductive material; and a plurality of connecting arms respectively coupled between respective adjacent protective regions, each protective region coupled to at least one other protective region by a pair of respective connecting arms, each respective connecting arm being approximately tangential to each of the coupled protective regions, each of the connecting arms being the electrically conductive material.

20. The protective structure of claim 19 wherein one of the connecting arms of the pair is an approximate mirror image of the other of the connecting arms of the pair with respect to a line approximately bisecting the respective region.

21. The protective structure of claim 19 wherein the connecting arms are curved.

22. The protective structure of claim 19 wherein the electrically conductive material comprises one of a resistive material and doped portions of a semiconductor material forming a plurality of diodes coupled together in anti-series.

23. A method for distributing voltage from an electric field emanating from a source, comprising:

disposing a plurality of alternately concentric electrically conductive regions on a device around the source of an electric field, each of the conductive regions being in the shape of a closed polygon; and electrically coupling each of the conductive regions to at least one other of the conductive regions by arms that tangentially connect with each of the interconnected regions at respective coupling points that are offset from each other by approximately 180 degrees such that voltage from the electric field is distributed approximately uniformly over the plurality of conductive regions.

24. The method of claim 23 wherein the conductive regions comprise one of a resistive material and doped portions of a semiconductor material forming a plurality of diodes coupled together in anti-series.

25. The structure according to claim 1 wherein said protective regions are formed in said substrate.

26. The structure according to claim 1 wherein said protective regions are formed over said substrate, and further comprising an insulating layer positioned between said substrate and said protection regions.

27. A protection structure for high-voltage integrated electronic devices, comprising:

a semiconductor substrate having first and second spaced apart voltage regions;

a plurality of protection regions of electrically conductive material formed between the respective first and second voltage regions, wherein said protection regions extend along adjacent closed lines arranged one inside another, and are connected in series by pairs of tangency areas, the distance between adjacent closed lines increasing from an inner closed line to an adjacent outer closed line along the tangency area.

28. The protection structure of claim 27, wherein the tangency areas are connected between adjacent inner and outer closed lines at respective coupling points that are offset from each other by approximately 180 degrees.

29. The protection structure of claim 28, wherein the distance between adjacent inner and outer closed lines increasing from a minimum at the coupling point to the inner closed line to a maximum at the coupling point to the outer closed line.

30. A protection structure comprising:

a substrate of semiconductor material;

a plurality of protection regions having increased doping concentrations relative to said semiconductor material, said protection regions arranged in concentrically formed closed lines with each closed line contiguous with an adjacent closed line along at least a portion of said adjacent closed line and said contiguous portion alternating on either side of a respective closed line and reciprocally interconnecting said adjacent closed lines in series.

31. The protection structure of claim 30, wherein a first said contiguous portion interconnecting a first closed line to a first said adjacent closed line is positioned on an opposite side of said first closed line from a second said contiguous portion interconnecting said first closed line to a second said adjacent closed line.

32. The protection structure of claim 31, wherein said closed lines further comprise substantially cylindrical rings.

33. The protection structure of claim 31, wherein said closed lines further comprise one of oval and square rings.

34. The protection structure of claim 31, wherein said increased doping concentrations further comprise doping of an opposite conductivity type from said substrate.

35. A device comprising:
 a semiconductor substrate having first and second different voltage areas;
 a first plurality of protection regions having a first geometric center location, each first region being in the shape of a closed line;
 a second plurality of protection regions having a second geometric center location, each second region being in the shape of a closed line;
 the first geometric center being offset from the second geometric center a selected distance such that each of the first plurality of protection regions intersects at a tangent point with a corresponding region from the second plurality of protection regions.

36. The device according to claim 35, wherein each region in the first plurality is spaced from each adjacent region in the first plurality by an equal distance.

37. The device according to claim 35, wherein each region in the second plurality is spaced from each adjacent region in the second plurality by an equal distance.

38. A device comprising:
 a semiconductor substrate having spaced apart relatively high and low voltage areas;
 a first plurality of protection regions formed in the semiconductor substrate having a first common geometric center location, each region being in the shape of a closed line;
 a second plurality of protection regions formed in the semiconductor substrate having a second common geometric center location, each region being in the shape of a closed line;
 an intersection location between adjacent regions within the first plurality and the second plurality, the distance between each of the adjacent regions increasing from the intersection location between the adjacent regions to a maximum distance at a location spaced from the intersection location.

39. The device according to claim 38, wherein one of the high and low voltage areas is surrounded by the first and second plurality of protection rings and another of the high and low voltage areas is positioned outside the first and second plurality of protection rings.

40. The device according to claim 39, wherein the location of the maximum distance is 180 degrees spaced from the intersection location.

41. The device according to claim 40, wherein the protection regions within the first plurality and the second plurality further comprise one of cylindrical rings oval rings, and rectangular rings.

* * * * *